US008880278B2

(12) United States Patent
Ric et al.

(10) Patent No.: US 8,880,278 B2
(45) Date of Patent: Nov. 4, 2014

(54) METHOD AND DEVICE FOR ACCESSING MAINTENANCE FUNCTIONS OF AN AIRCRAFT FROM A MOBILE MAINTENANCE TERMINAL

(75) Inventors: Georges Ric, Frouzins (FR); Francois Beltrand, Villeneuve Tolosane (FR); Pierre-Marie Julaud, Toulouse (FR); Philippe Moreau, Toulouse (FR); Michel Bovet, Tournefeuille (FR); Jean-Luc Marty, Montbrun Lauragais (FR)

(73) Assignees: Airbus S.A.S., Blagnac (FR); AIRBUS Operations S.A.S., Toulouse (FR)

( * ) Notice: Subject to any disclaimer, the term of this patent is extended or adjusted under 35 U.S.C. 154(b) by 302 days.

(21) Appl. No.: 12/908,372

(22) Filed: Oct. 20, 2010

(65) Prior Publication Data
US 2011/0106366 A1    May 5, 2011

(30) Foreign Application Priority Data

Nov. 5, 2009   (FR) ...................... 09 57852

(51) Int. Cl.
| | | |
|---|---|---|
| G06F 7/76 | (2006.01) | |
| B64F 5/00 | (2006.01) | |
| H04L 29/08 | (2006.01) | |
| G07C 5/08 | (2006.01) | |
| G01R 31/00 | (2006.01) | |

(52) U.S. Cl.
CPC ............ *B64F 5/0045* (2013.01); *G07C 5/0816* (2013.01); *G01R 31/008* (2013.01); *H04L 67/12* (2013.01)
USPC ........ 701/31.4; 701/29.1; 701/32.7; 701/32.8

(58) Field of Classification Search
USPC ......... 701/2, 3, 14, 24, 29.1, 29.2, 29.3, 29.4, 701/31.4, 31.5, 31.6, 31.7, 31.8, 32.6, 32.7, 701/32.8, 33.2, 33.4, 34.2, 34.3, 34.4; 702/184; 370/352
See application file for complete search history.

(56) References Cited

U.S. PATENT DOCUMENTS

| | | | | |
|---|---|---|---|---|
| 5,023,791 A | * | 6/1991 | Herzberg et al. ............ | 701/33.4 |
| 6,567,729 B2 | * | 5/2003 | Betters et al. ................ | 701/32.1 |

(Continued)

FOREIGN PATENT DOCUMENTS

FR        2 914 804 A1    10/2008

OTHER PUBLICATIONS

French Preliminary Search Report issued Aug. 16, 2010 in FR 09 57852 filed Nov. 5, 2009 (with English Translation of Category of cited documents).

*Primary Examiner* — Helal A Algahaim
*Assistant Examiner* — Dale W Hilgendorf
(74) *Attorney, Agent, or Firm* — Oblon, Spivak, McClelland, Maier & Neustadt, L.L.P.

(57) ABSTRACT

A method and device for accessing maintenance functions of an aircraft from a mobile maintenance terminal. First, the situation of the aircraft is determined. Then, if this situation allows a mobile maintenance terminal to access a maintenance information system on the ground and the information system of the aircraft, a connection is established between the mobile maintenance terminal and the maintenance information system on the ground and at least one maintenance command intended for the information system of the aircraft is transmitted to the maintenance information system on the ground. If this situation allows the mobile maintenance terminal to access only the information system of the aircraft, a connection is established between the mobile maintenance terminal and the information system of the aircraft and at least one maintenance command is transmitted to the information system of the aircraft.

17 Claims, 7 Drawing Sheets

(56) References Cited

U.S. PATENT DOCUMENTS

| | | | |
|---|---|---|---|
| 6,716,762 B1* | 4/2004 | Lenz | 438/710 |
| 6,816,762 B2* | 11/2004 | Hensey et al. | 701/32.6 |
| 6,959,236 B2* | 10/2005 | Betters et al. | 701/32.1 |
| 2004/0106404 A1* | 6/2004 | Gould et al. | 455/431 |
| 2006/0004499 A1* | 1/2006 | Trego et al. | 701/29 |
| 2007/0115938 A1* | 5/2007 | Conzachi et al. | 370/352 |
| 2007/0124222 A1* | 5/2007 | Avery et al. | 705/29 |
| 2009/0138871 A1* | 5/2009 | Kimberly et al. | 717/173 |
| 2009/0192659 A1* | 7/2009 | Beebe et al. | 701/2 |
| 2010/0312420 A1* | 12/2010 | Sham et al. | 701/3 |

* cited by examiner

METHOD AND DEVICE FOR ACCESSING MAINTENANCE FUNCTIONS OF AN AIRCRAFT FROM A MOBILE MAINTENANCE TERMINAL

BACKGROUND OF THE INVENTION

This invention relates to maintenance operations of aircraft and more particularly to a method and a device for accessing maintenance functions of an aircraft from a mobile maintenance terminal. Access to these functions varies according to the situation of the aircraft (in operation or at its base).

In order to optimize the reliability of aircraft and to increase their profitability, maintenance operations frequently are implemented between flight phases. They may or may not be carried out when the aircraft is at its base.

In general, for maintenance operators such operations consist, for example, in verifying the hardware and software configuration of the systems of the aircraft, analyzing the data stored during the flight (ongoing monitoring), modifying certain parameters of the aircraft or certain software data, launching test software applications and/or checking the change of software configuration following a downloading operation.

The analyzed data often originate from sensors and are stored in a central diagnostic and storage device accessible through a man-machine interface of MCDU (abbreviation for Multi-Control Display Unit in English terminology) or OMT (abbreviation for Onboard Maintenance Terminal in English terminology) type. This interface, through which interactive operations may be launched, makes it possible to analyze stored data, access the parameters of the aircraft and more generally to execute test and maintenance functions.

Access to the maintenance systems of aircraft generally is limited to on-board fixed physical stations in the cockpit. Thus, when the aircraft is on the ground, a maintenance operator may board the aircraft in order to access and analyze the stored data, if need be modify the parameters of the aircraft, and launch test applications.

Alternatively, in order to meet a growing demand of the airline companies to reduce the time of maintenance operations, mobile maintenance terminals are used. The latter, the function of which is similar to the interfaces of MCDU or OMT type, are connected to the central diagnostic and storage device through connection plugs connected to the network of the aircraft.

Figure 1:
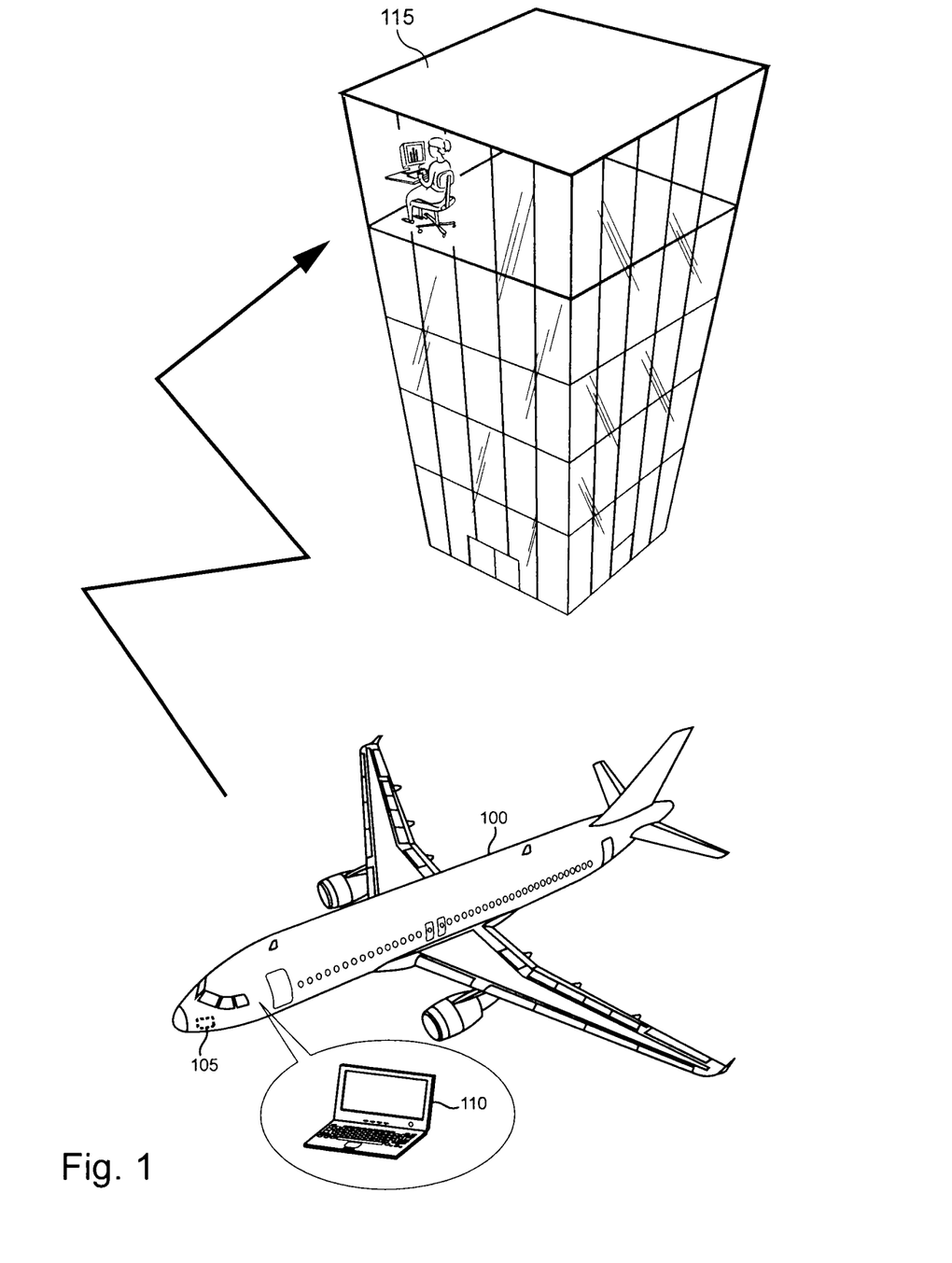
FIG. 1 shows an aircraft comprising a central diagnostic and storage device able to be accessed by a maintenance terminal and able to transmit data to a maintenance information system on the ground.

FIG. 1 illustrates an exemplary aircraft 100 comprising a central diagnostic and storage device 105. This device is accessible, via an internal communication network (not shown), at a maintenance terminal 110, fixed or mobile. The mobile maintenance terminals generally are called PMAT (acronym for Portable Maintenance Access Terminal in English terminology).

Device 105 is connected to all the systems of the aircraft generating maintenance messages, for example to sensors (not shown) for monitoring the engines and the actuators for the landing gears and control surfaces.

In this way, when aircraft 100 is on the ground, with the aid of terminal 110 a maintenance operator may analyze the flight data of the aircraft and modify the parameters thereof.

Furthermore, the airline companies operating these aircraft generally have maintenance information systems on the ground, also called MIS (acronym for Maintenance Information System in English terminology), in order to ensure the tracking of the state of their fleet of aircraft. These information systems are operated in particular by maintenance control centers, also called MCC (abbreviation for Maintenance Control Center in English terminology), and maintenance operators of the airline company.

As illustrated on FIG. 1, data may be transmitted directly from an aircraft 100 to a maintenance information system of an airline company 115, for example through an IP (abbreviation for Internet Protocol in English terminology) type link. These data may be processed by the maintenance information systems for tracking the state of the fleet of aircraft. Moreover, these data make it possible to build up the experience acquired during the operation of the aircraft and thus optimize maintenance operations.

In this way, although maintenance operations may be executed from a mobile maintenance terminal and maintenance data originating from the aircraft may be used to optimize the maintenance operations, there nonetheless is a need to improve them.

The invention makes it possible to resolve at least one of the problems set forth above.

SUMMARY OF THE INVENTION

The invention thus has as an object a method for a mobile maintenance terminal to access maintenance functions of an information system of an aircraft, this method comprising the following steps,
  determining the situation of the said aircraft;
  if the said situation makes it possible to access a maintenance information system on the ground and the said information system of the said aircraft,
    establishing a connection between the said mobile maintenance terminal and the said maintenance information system on the ground; and,
    transmitting at least one maintenance command intended for the said information system of the said aircraft to the said maintenance information system on the ground;
  if the said situation makes it possible to access only the said information system of the said aircraft,
    establishing a connection between the said mobile maintenance terminal and the said information system of the said aircraft; and,
    transmitting at least one maintenance command to the said information system of the said aircraft.

In this way the method according to the invention makes it possible to establish a connection between a mobile maintenance terminal and an information system of an aircraft in order to ensure maintenance functions. This connection is, if possible, established via a maintenance information system on the ground in order to make it possible to access a set of tools of this system, if need be. The method according to the invention further enables a maintenance information system on the ground to retrieve configuration data from an aircraft in order to ensure management thereof.

If the said situation makes it possible to access a maintenance information system on the ground and the said information system of the said aircraft, the method advantageously further comprises a step of accessing at least one information item from the said maintenance information system on the ground to help an operator using the mobile maintenance terminal to perform a maintenance task.

The method preferably further comprises a step of accessing at least one maintenance datum from the said information system of the said aircraft in order to enable an operator using the mobile maintenance terminal to perform certain parts of a maintenance task.

According to a specific embodiment, the method further comprises a step of securing the said mobile maintenance terminal if the said situation makes it possible to access only the said information system of the said aircraft so as not to create a weak point as regards the security of the information system of the aircraft.

Still according to a specific embodiment, the said connection between the said mobile maintenance terminal and the said maintenance information system on the ground or the said information system of the said aircraft is in compliance with the IP protocol. It preferably is established through a secured tunnel. Advantageously, a wireless connection is involved.

Still according to a specific embodiment, the method further comprises a step of receiving at least one execution result of the execution of the said at least one command in order to enable an operator using the mobile maintenance terminal to perform certain parts of a maintenance task.

The invention also has as an object a computer program comprising instructions adapted for the implementation of each of the steps of the method described above when the said program is executed on a computer as well as a mobile maintenance terminal comprising means adapted for the implementation of each of the steps of the method described above.

The advantages obtained with this computer program and this mobile maintenance terminal are similar to those mentioned above.

BRIEF DESCRIPTION OF THE DRAWINGS

Other advantages, purposes and characteristics of this invention become apparent from the detailed description that follows, presented by way of non-limitative example, with reference to the attached drawings in which.

DETAILED DESCRIPTION OF THE INVENTION

In general, the invention makes it possible to perform maintenance operations in an aircraft from a mobile maintenance terminal (PMAT) according to two different modes linked to the situation of the aircraft, in operation or at its base.

It uses the information system, the maintenance functions and the communication means of the aircraft as well as the maintenance tools deployed on the ground and mobile maintenance stations in order to enable the maintenance operators to benefit from both modes of access to the maintenance functions of the aircraft.

The communication means implemented among the information systems of the aircraft, the information systems on the ground and the mobile terminals preferably are in compliance with the IP (abbreviation for Internet Protocol in English terminology) protocol.

According to a first mode implemented when the aircraft is at its base, the maintenance operator may access data and maintenance functions of the aircraft as well as information items from maintenance information systems on the ground (MIS). The operator thus has the means for establishing a diagnosis of the aircraft, for consulting the databases of the MIS and for performing the maintenance operations required to allow the aircraft to perform its missions and anticipate possible failures.

According to a second mode, the maintenance operator may access only maintenance data of the aircraft when the aircraft is not at its base. The operator thus has the means for establishing a diagnosis of the aircraft and for performing the maintenance operations necessary to allow the aircraft to continue its mission.

In the first mode, when the aircraft is at its base, the operator uses a PMAT configured to connect to the MIS, with a wired or wireless link. The MIS here comprises an interface making it possible to implement a secured connection with the aircraft giving it remote access to data and maintenance functions. In this way the operator may connect to the aircraft via the MIS. He thus may access a considerable number of information items enabling him to benefit from the real-time analysis and engineering skills of the ground crews.

In the second mode, when the aircraft is not at its base, the maintenance operator uses a PMAT configured to connect only to the aircraft on which the operator is going to intervene. In this mode, only the data and the maintenance functions of the aircraft are accessible. The maintenance operator therefore limits his intervention to the diagnosis of the aircraft and to the necessary maintenance operations, making it possible to ensure the level of safety required for continuation of the mission of the aircraft.

In this way the invention makes it possible to reduce the downtime of aircraft on the ground and to improve the reliability of the maintenance operations by providing all the data useful to the maintenance operators.

It is seen here that, by default, when they are activated, the mobile maintenance terminals try to connect to the MIS before attempting a direct connection to an aircraft in order to allow the maintenance operators to access the MIS information items, if possible.

The generation of the on-board information system in some modern aircraft depends on an architecture that allows the aircraft to be interconnected with a data communication network on the ground via secured IP communication means while ensuring that the components making it possible to achieve aircraft safety are in accordance with the required confidence level.

By way of illustration, the platform supporting the maintenance functions may be developed in accordance with the aeronautical standard DO-178B (standard for software development quality level according to a given target, for example software quality assurance level DAL C).

The platform supporting the maintenance functions thus is such that the information items originating therefrom are reliable data.

Moreover, in order to ensure a sufficient level of data security, a robust data-flow filtering element is placed in particular in the information system of the aircraft. It allows the aircraft, via the secured IP communication means, to be regarded as an extension of the network of the airline company operating this aircraft without compromising the safety thereof.

The information system of the airline company thus may retrieve data from the platform supporting the maintenance functions and execute these functions in automatic and deported manner.

Figure 2:
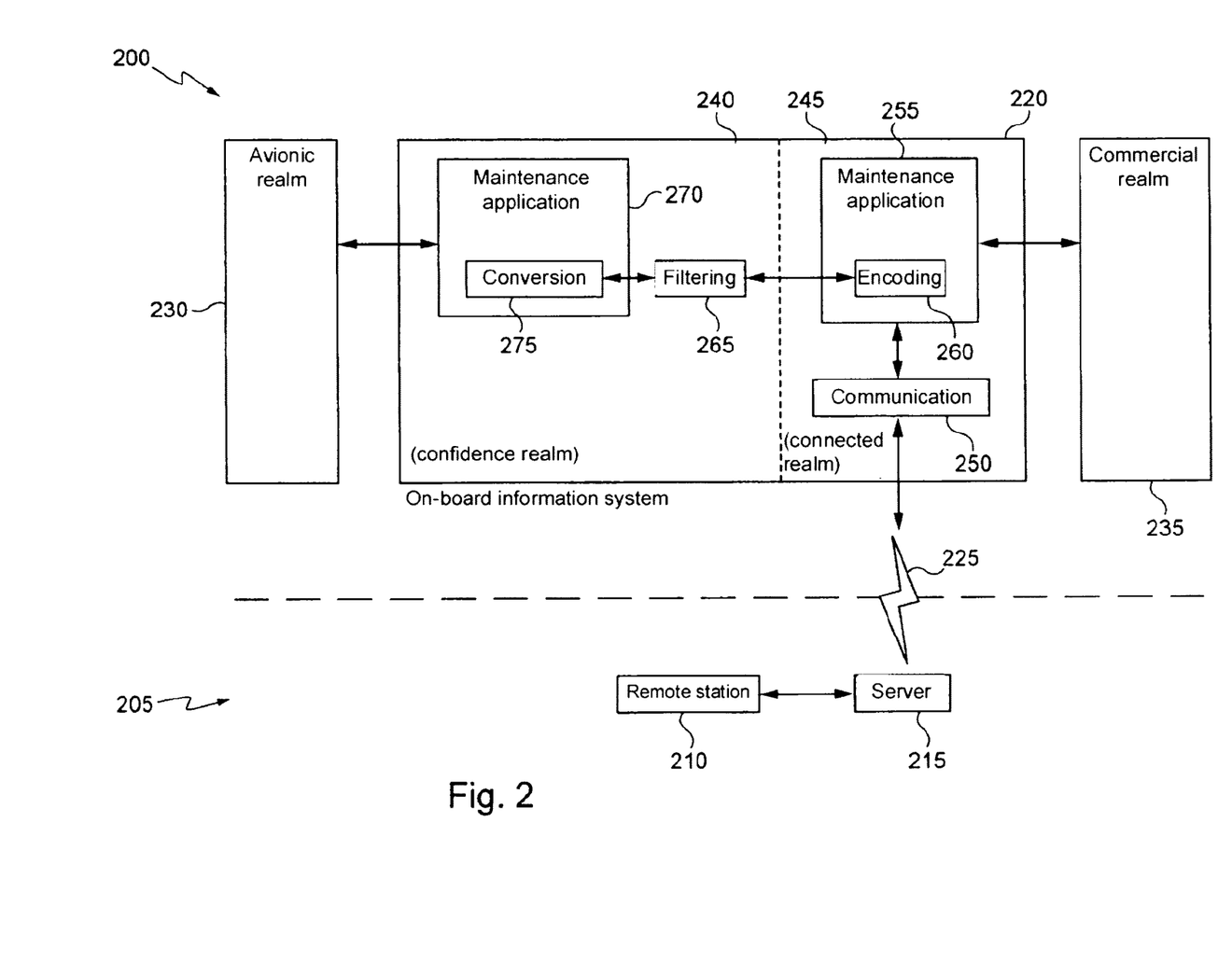
FIG. 2 schematically illustrates the architecture of a part of the information system of an aircraft allowing an information system of an airline company to access data and maintenance functions of the aircraft.

FIG. 2 schematically illustrates the architecture of a part of the information system of an aircraft allowing an information system of an airline company to access data and maintenance functions of the aircraft.

Reference 200 here designates the systems taken on board the aircraft while reference 205 designates remote systems of the airline company operating the aircraft.

The remote system comprises a remote station 210, for example a computer of PC (abbreviation for Personal Computer in English terminology) type, and a server 215 making it possible to establish a data communication with on-board information system 220 of the aircraft through network 225.

Two types of data may be processed by the remote station or the test station: the data originating from the aircraft and the command data making it possible to execute maintenance functions on board the aircraft.

On-board information system 220 of the aircraft is connected to avionic systems 230, for example the flight control systems, the automatic pilot and the environmental monitoring systems, and to systems of the commercial realm 235, referred to as "open," unlike the avionic realm, because of the origin of the processed data.

Furthermore, on-board information system 220 comprises two parts, a specially secured part 240, called confidence realm, and a less secured part 245, called connected realm.

Less secured part 245 comprises communication module 250 adapted for receiving and transmitting data from and to network 225, for example according to the IP protocol. Communication between server 215 and communication module 250 preferably is carried out through a secured tunnel such as a VPN (abbreviation for Virtual Private Network in English terminology) link.

Communication module 250 is connected to a maintenance application module 255 that itself comprises an encoding module 260 used to encode the data to be transmitted to secured part 240 of on-board information system 220.

Secured part 240 comprises a filtering module 265 adapted for controlling the data transmitted by less secured part 245.

Secured part 240 further comprises a maintenance application module 270 itself comprising a conversion module 275 adapted for converting the data received from filtering module 265 so that they may be used by maintenance application module 270.

As illustrated, maintenance application module 255 of less secured part 245 is connected to the systems of the commercial realm 235 while maintenance application module 270 of secured part 240 is connected to the systems of the avionic realm 230.

Figure 3:
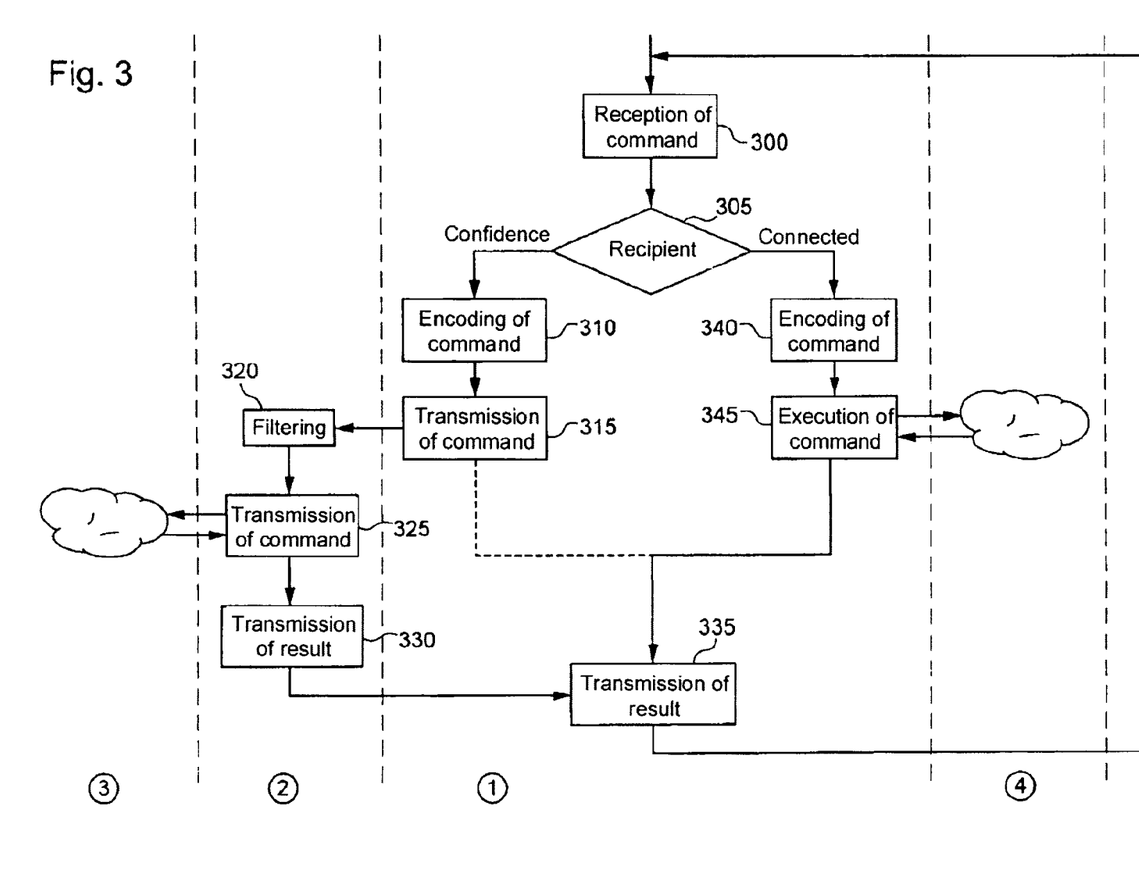
FIG. 3 schematically illustrates an exemplary algorithm implemented in an information system of an aircraft to make it possible to access maintenance functions of the aircraft remotely.

FIG. 3 schematically illustrates an exemplary algorithm implemented in an information system of an aircraft in order to allow remote access to maintenance functions of the aircraft.

Reference ① here designates the part of the algorithm implemented in the unsecured part of the information system of the aircraft, reference ② designates the part of the algorithm implemented in the secured part of the information system of the aircraft, reference ③ designates the functions implemented in the confidence realm, that is to say here the avionics, and reference ④ designates the functions implemented in the commercial realm.

After having received a command (step 300) from a remote post via, for example, a secured communication tunnel established beforehand, a test is performed (step 305) in order to identify the recipient of the received command.

If the recipient of the received command is located in the confidence realm, the command is encoded (step 310) in order to make it compatible with the robust filter used at the input of the secured part, then transmitted to the latter (step 315). The command and/or data exchange between the secured and unsecured parts preferably is carried out via a dedicated internal network.

The encoding consists, for example, in encoding the commands in the form of frames having a predetermined format and/or characteristics. The filtering then consists in verifying this format and/or these characteristics.

As indicated above, when the secured part of the information system of the aircraft receives a command from the unsecured part, the received command is filtered (step 320) with the aid of a robust filter. The commands not in accordance with the predetermined criteria of the filter are rejected. The filtered commands are converted or translated (step 325) by a translation module of the secured part in order to allow their execution by the intended maintenance function.

The maintenance function sought, for example a test management module or a test configuration management module, executes the received command or manages its execution and, preferably, sends a response, for example a configuration or a result, to the command translation module which constructs a corresponding file. This file then is transmitted (step 330) to the maintenance function of the unsecured part of the information system of the aircraft which transfers the received information items to the remote station (step 335).

If the recipient of the received command is located in the connected realm, the command is encoded (step 340) in standard manner to make it compatible with the protocols used in the systems of the connected realm. It then is executed (step 345) and, if a response is determined, the latter is transmitted to the remote station (step 335).

As indicated above, the filter has as an object to filter the data received from the network so as to transmit only the correctly formatted data to the secured part of the information system of the aircraft.

The filtering module preferably is based on the principle of the screen, that is to say an iterative mechanism, according to which several levels of filters are used to optimize the processing times. It thus is composed of several elements making it possible to filter the received data more and more finely so as to let only the data corresponding to valid commands go through. An example of such a robust filter is described in the patent application FR 2 927 181 filed in the name of the company Airbus France.

The filtering module requires that a command format be defined so as to process only a certain type of network frames. The format and the associated transport protocol may be defined in the form of parameters, accessible to the filtering module. For example, such parameters may specify that the commands are received in the form of Ethernet frames, indicate the sources authorized to transmit such commands, give a maximal lifetime for the frames beyond which the frames are not taken into account and indicate the characters that may be used validly for encoding a command in a frame.

By way of illustration, the filtering of Ethernet frames may be performed in three steps.

Figure 4:
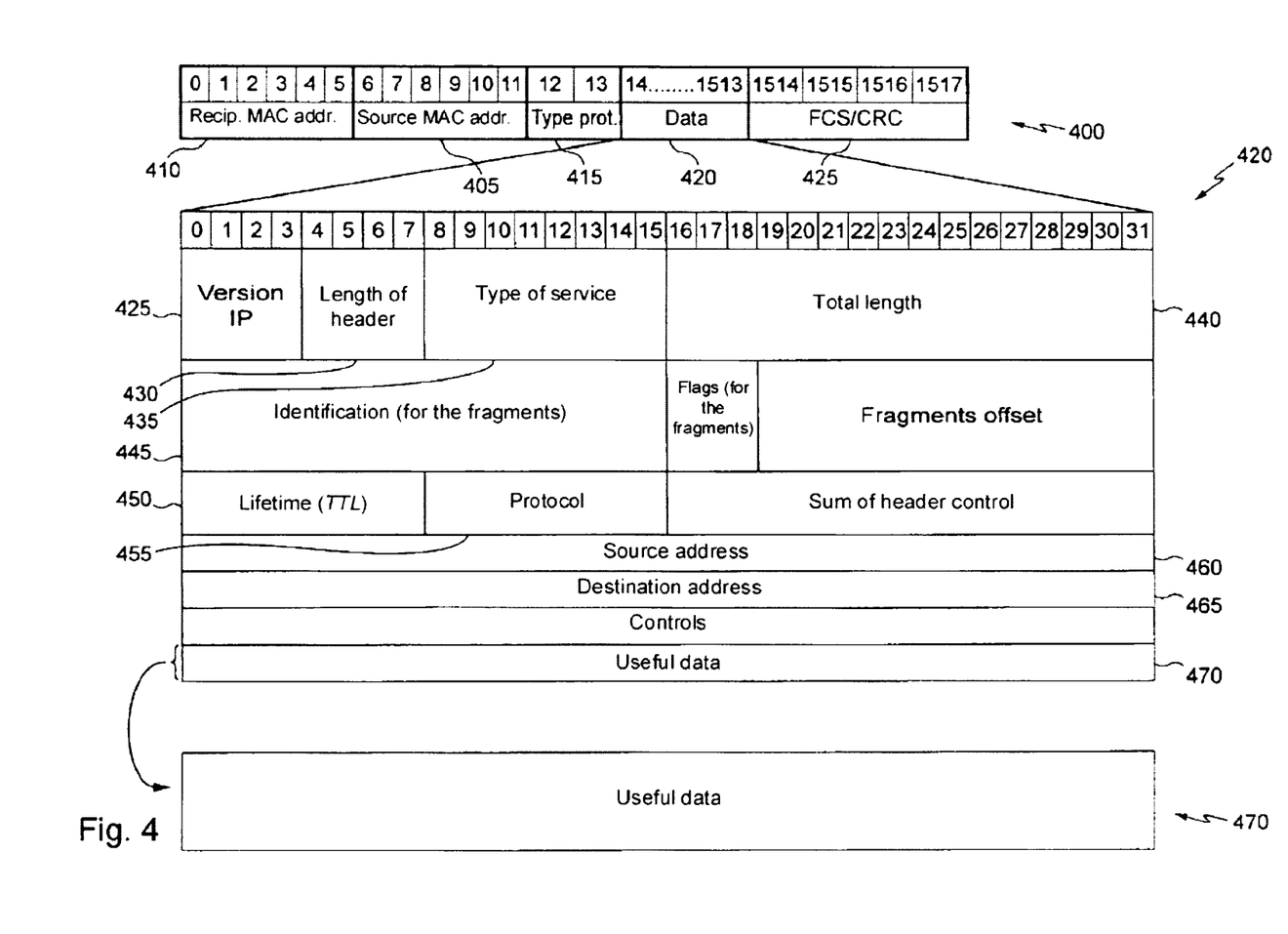
FIG. 4 partially shows an Ethernet frame on which a filtering may be performed.

FIG. 4 partially shows an Ethernet frame 400 on which a filtering may be performed according to these three steps.

First of all, each frame is analyzed by verifying, for example, source physical address 405 and destination physical address 410, in particular the MAC (acronym for Media Access Control in English terminology) addresses, type of protocol 415 and signature 425 of the complete frame. Data 420 of the frame are not analyzed in this first step.

If source physical address 405 and destination physical address 410, type of protocol 415 and signature 425 are not in accordance with the parameters of the filtering module, the frame is rejected.

On the contrary, if source physical address 405 and destination physical address 410, type of protocol 415 and signature 425 are in accordance with the parameters of the filtering module, a second filtering step is implemented.

It should be noted here that the first filtering step may focus on data other than those mentioned or, on the contrary, fewer data.

The second step consists, for example, in analyzing the header of the data 420. In particular, this second filtering step may consist in verifying IP version 425, length 430 of the header, type of service 435, total length 440 of the data, identification 445 used to reconstitute the fragments, lifetime 450, also called TTL (abbreviation for Time To Live in English terminology), protocol 455 and source address 460 and destination address 465.

Again, if all these information items are not in accordance with the parameters of the filtering module, the frame is rejected. On the contrary, if all these information items are in accordance with the parameters of the filtering module, a third filtering step is implemented.

It also should be noted here that the second filtering step may focus on data other than those mentioned or, on the contrary, fewer data.

The third step here consists in analyzing the characters of the useful data 470 of the frame. This step thus makes it possible to verify that the characters necessary for construction of the command may not be used to construct an executable code. Advantageously, all the characters of the useful data should be chosen in the ASCII table, in the values ranging between 032 and 090.

If a character of the useful data 470 does not belong to the ASCII table, between the values 032 and 090, the frame is rejected. On the contrary, if all the characters of the useful data 470 belong to the ASCII table, between the values 032 and 090, the frame is transmitted to the secured part of the information system of the aircraft to be processed there.

Naturally, the third filtering step may focus on other criteria, in particular more restrictive criteria.

The translation of filtered commands has as an object to establish an interface between the maintenance functions and the network.

This module preferably is developed so that only the commands linked to instructions corresponding to maintenance functions implemented in the secured part of the information system of the aircraft have an effect. This means that this module knows the instructions that may be executed by each application. In other words, a list of instructions or sequence of instructions preferably is stored beforehand. Such a list defines a set of configurations of possible strings of instructions. This list also may define prohibited combinations.

This configuration is constructed in such a way that the string of instructions for an application is known a priori. This enables the conversion to verify that the commands that it receives and the string of the associated instructions are in accordance with what the application is supposed to execute.

This verification enables the conversion module to reject any unexpected string and thus ensures that dangerous operations cannot be executed.

In a specific embodiment, the conversion module uses a table of correspondence between the names of the commands and the actual functions, that is to say the sequences of instructions, so as to associate one or more instructions with the names of commands received from the remote station. It should be noted here that the instructions may take several forms. For example, pointers to functions or commands interfaced with the operating system of the maintenance device are involved. The instructions make it possible in particular to simulate an action input by a user on the interface of the maintenance device accessible in the aircraft.

After a command has been analyzed and declared in conformity, the conversion module transmits the instructions corresponding to the application concerned. The application executes the instructions and generally sends back a response. This response is received by the conversion module which constructs a response message, preferably signed.

Figure 5:
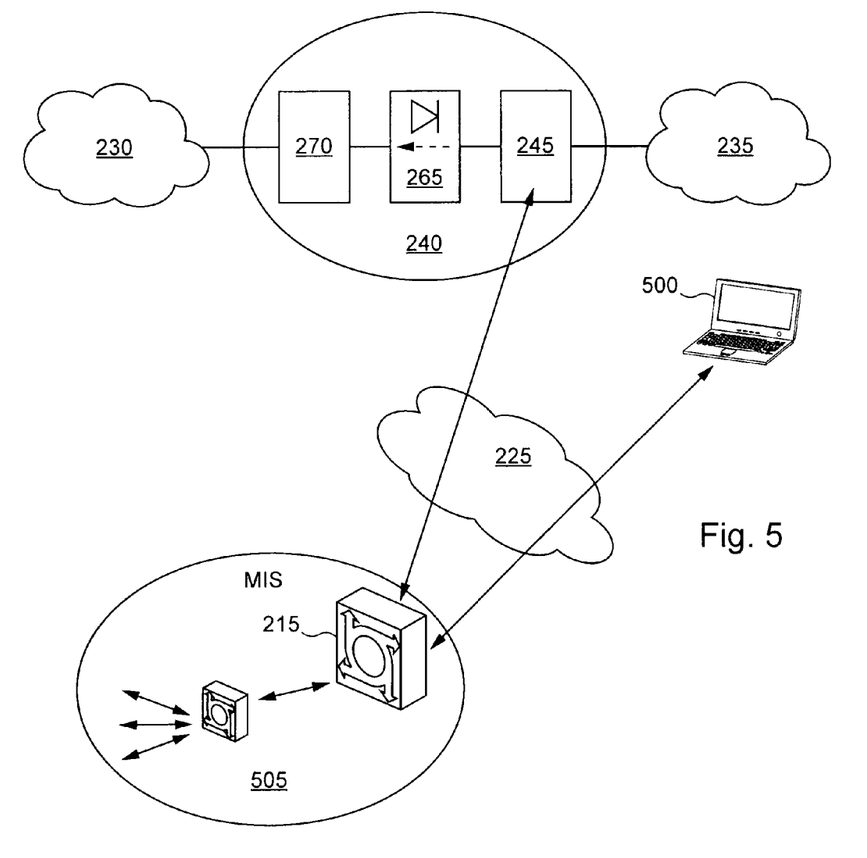
FIG. 5 illustrates the first mode for connection of a PMAT to an information system of an aircraft, via a maintenance information system on the ground.

FIG. 5 illustrates the first mode for connection of a PMAT to an information system of an aircraft, via a maintenance information system on the ground, for example a ground maintenance system of an airline company operating this aircraft.

As indicated above, when a PMAT is activated, it first attempts to connect to an information system on the ground before trying to connect to that of an aircraft. These connections, wired or wireless, are secured.

Thus when PMAT 500 is connected to communication network 225 to which an MIS 505 also is connected, it connects to the latter according to a standard protocol. More precisely, PMAT 500 connects to a server 215 of MIS 505 to which tools and databases (not shown) of the airline company operating the aircraft may be connected.

Similarly, information system 220 of an aircraft may connect to MIS 505 via network 225 or a separate network. For these purposes, server 215 here connects to part domain 245 of information system 220 via communication module 250 (not shown). As indicated above, part 245 is connected to the systems of commercial realm 235 as well as to maintenance applications 270, via robust filter 265, to which the avionics 230 is connected.

Advantageously, PMAT 500 and information system 220 are connected to communication network 225 by a wireless link. Moreover, in order to ensure the mobility of the maintenance operator around and in the aircraft, a wireless network of the aircraft is configured as an extension of network 225 so as to allow connection of PMAT 500 to MIS 505 via this wireless network of the aircraft. This particular function that may be implemented in certain wireless aircraft networks thus ensures an itinerancy function (called roaming in English terminology) for the PMAT between the outside and the inside of the aircraft.

When these connections are established, PMAT 500 may access information items from MIS 505 as well as data and maintenance functions of the aircraft via MIS 505.

Figure 6:
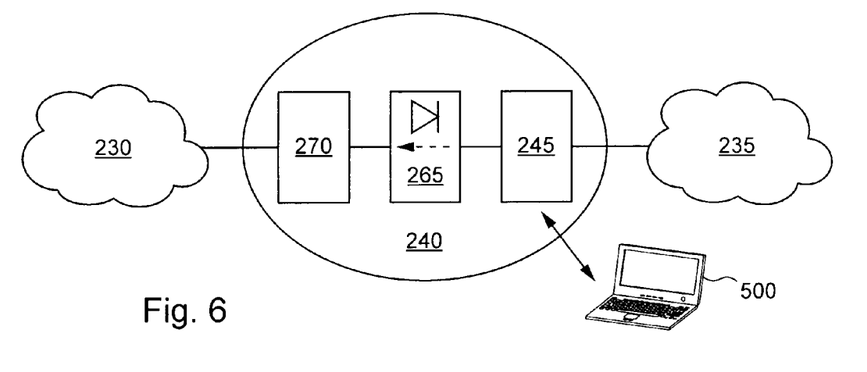
FIG. 6 illustrates the second mode for connection of a PMAT to an information system of an aircraft.

FIG. 6 illustrates the second mode for connection of a PMAT to an information system of an aircraft.

This communication mode is implemented when the PMAT is unable to connect to a maintenance information system on the ground. In this case, after having been activated and having attempted to connect to a maintenance information system on the ground, it endeavors to connect directly to that of an aircraft. This connection, wired or wireless, is secured.

For these purposes, PMAT 500 connects to part 245 of information system 220 via communication module 250 (not shown). As indicated above, part 245 is connected to systems of commercial realm 235 as well as to maintenance applications 270, via robust filter 265, to which the avionics 230 is connected.

When this connection is established, PMAT 500 is able to access data and maintenance functions of the aircraft.

Figure 7:
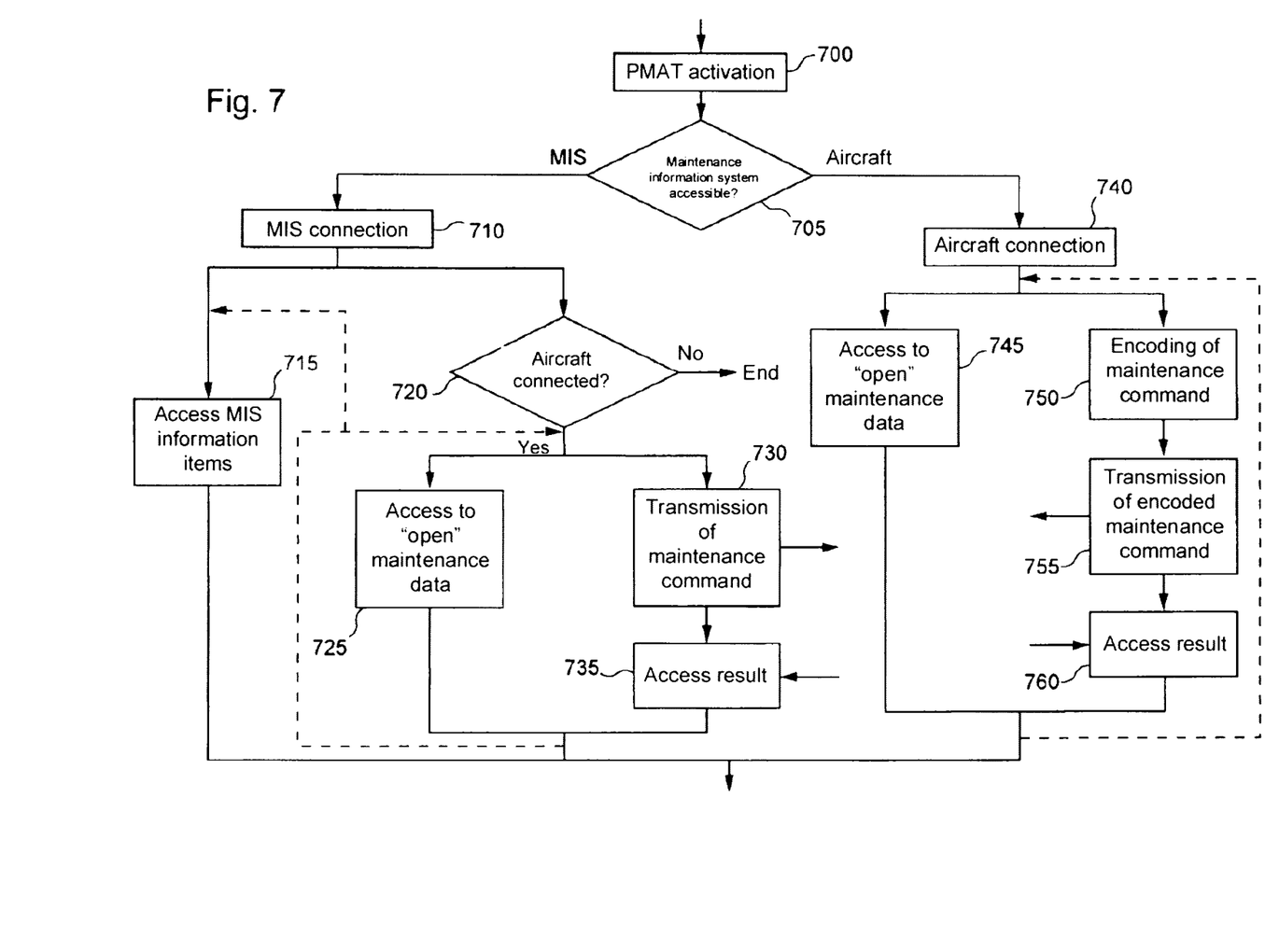
FIG. 7 schematically illustrates an exemplary algorithm implemented in a PMAT to access data and maintenance functions of an aircraft.

FIG. 7 schematically illustrates an exemplary algorithm implemented in a PMAT for accessing data and maintenance functions of an aircraft.

After having been activated (step 700), the PMAT performs a first test to determine the accessible maintenance information systems (step 705). This step may consist in identifying the communication networks able to be used by the PMAT and/or the maintenance information systems accessible via the communication networks and able to be used.

If a maintenance information system on the ground is accessible, the PMAT connects thereto (step 710).

The PMAT then may access certain information items from the MIS (step 715).

At the same time or sequentially, a test is performed (step 720) to determine whether the aircraft on which the maintenance operator using the PMAT is to perform maintenance operations is accessible, that is to say whether it is connected to the MIS.

This verification may consist in particular in verifying that an identifier of the aircraft considered is present in the list of identifiers of aircraft connected to the MIS.

If not, a failure message is transmitted to the maintenance operator.

If the aircraft is connected to the MIS and if the PMAT has rights allowing it to perform a maintenance operation, the maintenance operator may use the PMAT to access the "open" maintenance data (step 725), that is to say the maintenance data available in part 245 of information system 220 of the aircraft.

In this case, the maintenance operator also may use his PMAT to send out maintenance commands (step 730), for example a test request to an avionic equipment item or a request intended to obtain maintenance data from the confidence realm. These commands are transmitted to the MIS which translates them according to a predetermined format compatible with the information system of the aircraft and transmits them thereto.

After reception of these translated commands, the information system of the aircraft analyzes them and, if need be, creates the command or the set of commands requested. The commands created are compatible with the robust filter used to protect the avionics. They are transmitted to the maintenance applications accommodated in the confidence realm which execute them and preferably construct a result file which is transmitted to the communication module of the information system of the aircraft to be retransmitted to the MIS which advantageously creates a page that may be displayed from the PMAT (step 735).

Thus, in this operating mode, the maintenance operator may access data and maintenance functions of the aircraft as well as information items from the MIS. That allows him to benefit from the expertise of the entire maintenance community of the airline company operating the aircraft in order to perform the required maintenance operations.

If no maintenance information on the ground is accessible and an information system of an aircraft is accessible, the PMAT connects thereto (step 740).

In this case, the PMAT is first of all configured to be compatible with the safety level of the aircraft. This configuration has as an object to limit the capabilities of the PMAT, particularly in terms of communication and execution of applications (only communications and applications expressly accepted may be implemented in this configuration).

If the PMAT has rights allowing it to perform a maintenance operation, the maintenance operator may use the PMAT to access the "open" maintenance data (step 745), that is to say all the maintenance data available in part 245 of information system 220 of the aircraft. The maintenance operator thus may access, in particular, the electronic logbook, called e-logbook in English terminology, and consult the list of failures for which a repair is necessary.

Depending on the failure messages, the maintenance operator must be able to access the maintenance functions of the confidence realm. For these purposes, the maintenance operator may use his PMAT to send out maintenance commands to execute maintenance functions on board the aircraft and/or to access maintenance data of the confidence realm. These commands are transmitted in a predetermined format compatible with the information system of the aircraft. They therefore are encoded then transmitted (steps 750 and 755).

After reception of these commands, the information system of the aircraft analyzes them and, if need be, creates the command or the set of commands requested. The commands created are compatible with the robust filter used to protect the avionics. They are transmitted to the maintenance applications accommodated in the confidence realm which execute them. These commands concern, for example, an electrical switch command, a test command or a software loading command.

A result of execution of the command preferably is drawn up by the maintenance functions to be transmitted to the communication module of the information system of the aircraft which retransmits it to the PMAT (step 760).

According to a specific embodiment, the result of the maintenance operation is analyzed by the maintenance function of the connected realm in order, preferably after confirmation, to update the electronic logbook and enable it to process a subsequent failure, if need be.

Thus, in this operating mode, the maintenance operator may access data and maintenance functions of the aircraft.

As illustrated by the dotted-line arrows, the steps of transmitting a command as well as accessing data and information items may be repeated.

In this way the two operating modes of the PMAT enable a maintenance operator to use a single portable maintenance terminal, irrespective of the situation of the aircraft, at its base or not, while allowing him to benefit, if possible, from the expertise of the entire maintenance community of the airline company operating the aircraft.

Figure 8:
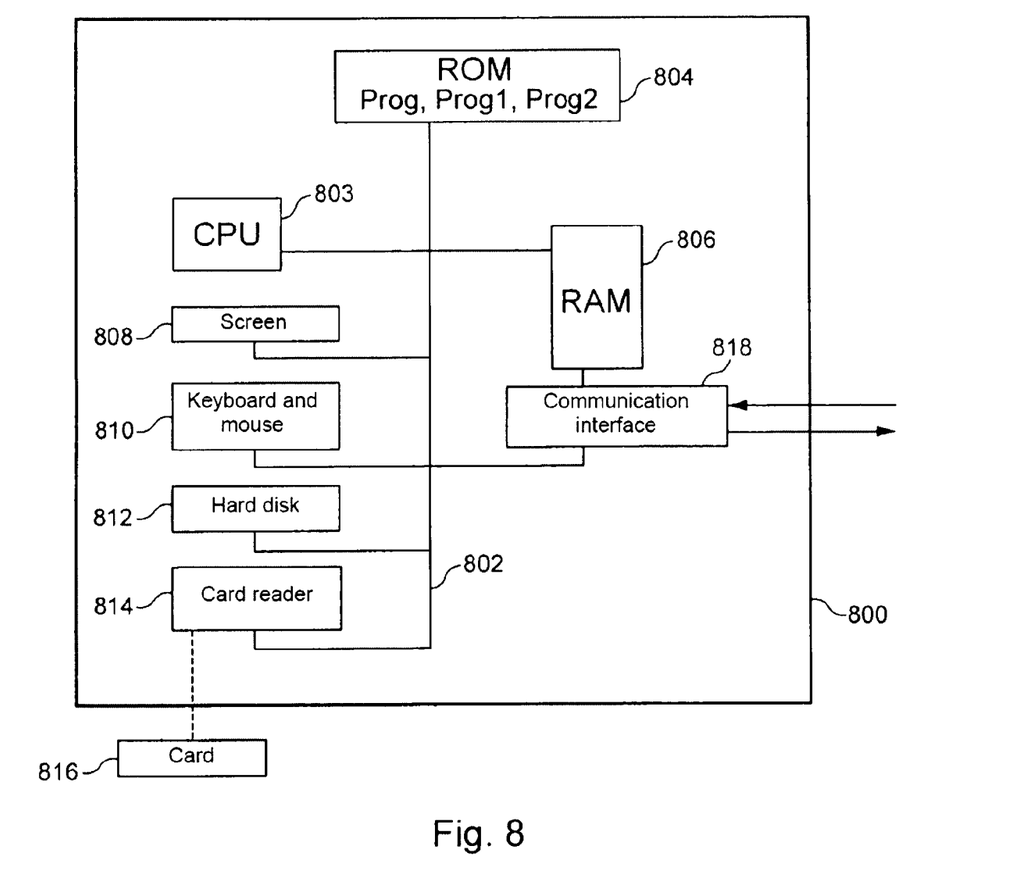
FIG. 8 illustrates an exemplary device adapted for implementing the invention or a part of the invention.

A device adapted for implementing the invention or a part of the invention is illustrated on FIG. 8. Device 800 is, for example, a portable computer of PC type.

Device 800 here comprises a communication bus 802 to which there are connected:

- a central processing unit or microprocessor 803 (CPU, Central Processing Unit);
- a read-only memory 804 (ROM, acronym for Read Only Memory in English terminology) that may comprise programs "Prog," "Prog1" and "Prog2";
- a random-access memory or cache memory 806 (RAM, acronym for Random Access Memory in English terminology) comprising registers adapted for recording variables and parameters created and modified during execution of the aforementioned programs; and, a communication interface 818 adapted for transmitting and receiving data.

Preferably, device 800 furthermore has:

- a screen 808 for displaying data and/or serving as a graphical interface with the user who will be able to interact with the programs according to the invention, with the aid of a keyboard and a mouse 810 or another pointing device such as a light pen, a touch screen or a remote control;
- a hard disk 812 that may comprise the aforementioned programs "Prog," "Prog1" and "Prog2" and data processed or to be processed according to the invention; and,
- a memory card reader 814 adapted for receiving a memory card 816 and for reading or writing therein data processed or to be processed according to the invention.

The communication bus allows communication and interoperability among the different components included in device 800 or connected thereto. The depiction of the bus is not imitative and, in particular, the central unit is capable of communicating instructions to any component of device 800 directly or through another component of device 800.

The executable code of each program allowing the programmable device to implement the processes according to the invention may be stored, for example, in hard disk 812 or in read-only memory 804.

According to a variant, memory card 816 may contain data, in particular signature keys, as well as the executable code of the aforementioned programs which, once read by device 800, will be stored in hard disk 812.

According to another variant, the executable code of the programs will be able to be received, at least in part, through interface 818, to be stored in a manner identical to that described above.

More generally, it will be possible for the program or programs to be loaded into one of the storage means of device 800 before being executed.

Central unit 803 is going to control and direct the execution of the instructions or portions of software code of the program or programs according to the invention, which instructions are stored in hard disk 812 or in read-only memory 804 or else in the other aforementioned storage components. During boot-up, the program or programs that are stored in a non-volatile memory, for example hard disk 812 or read-only memory 804, are transferred into random-access memory 806 which then contains the executable code of the program or programs according to the invention, as well as the registers for storing in memory the variables and parameters necessary for implementation of the invention.

Naturally, in order to meet specific needs, an individual competent in the field of the invention will be able to apply modifications in the foregoing description.

The invention claimed is:

1. A method for a mobile maintenance terminal to access maintenance functions of an information system of an aircraft, the method comprising:
    determining, by the mobile maintenance terminal, whether a maintenance information system server on the ground and the information system of the aircraft are both accessible by the mobile maintenance terminal;
    automatically establishing a connection via a network between the mobile maintenance terminal and the maintenance information system server on the ground, in response to determining that both the maintenance information system server on the ground and the information system of the aircraft are accessible by the mobile maintenance terminal;
    accessing, by the mobile maintenance terminal, the information system of the aircraft through the maintenance information system server on the ground, in response to determining that both the maintenance information system server on the ground and the information system of the aircraft are accessible by the mobile maintenance terminal;
    transmitting, by the mobile maintenance terminal, at least one maintenance command intended for the information system of the aircraft to the maintenance information system server on the ground, in response to the determining that both the maintenance information system server on the ground and the information system of the aircraft are accessible by the mobile maintenance terminal;
    automatically establishing a connection between the mobile maintenance terminal and the information system of the aircraft, in response to determining that only the information system of the aircraft is accessible by the mobile maintenance terminal; and
    transmitting at least one maintenance command to the information system of the aircraft, in response to determining that only the information system of the aircraft is accessible by the mobile maintenance terminal.

2. The method according to claim 1, further comprising:
    accessing at least one information item from the maintenance information system server on the ground, in response to determining that both the maintenance information system server on the ground and the information system of the aircraft are accessible by the mobile maintenance terminal.

3. The method according to claim 1 or claim 2, further comprising:
    accessing at least one maintenance datum from the information system of the aircraft.

4. The method according to claim 1, further comprising:
    securing the mobile maintenance terminal in response to determining that only the information system of the aircraft is accessible by the mobile maintenance terminal.

5. The method according to claim 1, wherein the connection between the mobile maintenance terminal and the maintenance information system server on the ground or the information system of the aircraft is in compliance with the IP protocol.

6. The method according to claim 5, wherein the connection between the mobile maintenance terminal and the maintenance information system server on the ground or the information system of the aircraft is established through a secured tunnel.

7. The method according to claim 6, wherein the secured tunnel is a Virtual Private Network.

8. The method according to claim 1, wherein the connection between the mobile maintenance terminal and the maintenance information system server on the ground or the information system of the aircraft is a wireless connection.

9. The method according to claim 1, further comprising:
    receiving at least one execution result from execution of the at least one command.

10. The method according to claim 1, wherein the mobile maintenance terminal translates the maintenance commands according to a predetermined format compatible with the information system of the aircraft.

11. The method according to claim 1, wherein
    the determining, by the mobile maintenance terminal, determining that both the maintenance information system server on the ground and the information system of the aircraft are accessible by the mobile maintenance terminal indicates that the aircraft is not in operation, and the determining, by the mobile maintenance terminal, determining that only the information system of the aircraft is accessible by the mobile maintenance terminal indicates that the aircraft is in operation.

12. The method according to claim 1, wherein the maintenance information system server is operated by maintenance control centers and maintenance operators of an airline company.

13. The method according to claim 1, wherein the mobile maintenance terminal, the maintenance information system server on the ground, and the information system of the aircraft are different from each other.

14. The method according to claim 1, wherein the automatically establishing of the connection between the mobile maintenance terminal and the information system of the aircraft, establishes the connection only between the mobile maintenance terminal and the information system of the aircraft, without establishing a connection between the mobile maintenance terminal and the maintenance information system server, in response to determining that only the information system of the aircraft is accessible by the mobile maintenance terminal.

15. The method according to claim 1, further comprising:

accessing, by the mobile maintenance terminal, an electronic logbook of the aircraft, in response to determining that only the information system of the aircraft is accessible by the mobile maintenance terminal and in response to a determination that the mobile maintenance terminal has an access right to perform a maintenance operation.

16. A non-transitory computer-readable storage medium storing instructions which when executed by a processor perform a method for a mobile maintenance terminal to access maintenance functions of an information system of an aircraft, the method comprising:

automatically determining, by the mobile maintenance terminal, whether a maintenance information system server on the ground and the information system of the aircraft are both accessible by the mobile maintenance terminal;

establishing a connection via a network between the mobile maintenance terminal and the maintenance information system server on the ground, in response to determining that both the maintenance information system server on the ground and the information system of the aircraft are accessible by the mobile maintenance terminal;

accessing, by the mobile maintenance terminal, the information system of the aircraft through the maintenance information system server on the ground, in response to determining that both the maintenance information system server on the ground and the information system of the aircraft are accessible by the mobile maintenance terminal;

transmitting, by the mobile maintenance terminal, at least one maintenance command intended for the information system of the aircraft to the maintenance information system server on the ground, in response to determining that both the maintenance information system server on the ground and the information system of the aircraft are accessible by the mobile maintenance terminal;

establishing a connection between the mobile maintenance terminal and the information system of the aircraft, in response to determining that only the information system of the aircraft is accessible by the mobile maintenance terminal; and transmitting at least one maintenance command to the information system of the aircraft, in response to determining that only the information system of the aircraft is accessible by the mobile maintenance terminal.

17. A mobile maintenance terminal for accessing maintenance functions of an information system of an aircraft, the mobile maintenance terminal comprising:

a processor configured to determine whether a maintenance information system server on the ground and the information system of the aircraft are both accessible by the mobile maintenance terminal, automatically establish a connection via a network between the mobile maintenance terminal and the maintenance information system server on the ground, in response to the processor determining that both the maintenance information system server on the ground and the information system of the aircraft are accessible by the mobile maintenance terminal, access the information system of the aircraft through the maintenance information system server on the ground, in response to the processor determining that both the maintenance information system server on the ground and the information system of the aircraft are accessible by the mobile maintenance terminal, transmit at least one maintenance command intended for the information system of the aircraft to the maintenance information system server on the ground, in response to the processor determining that both the maintenance information system server on the ground and the information system of the aircraft are accessible by the mobile maintenance terminal, automatically establish a connection between the mobile maintenance terminal and the information system of the aircraft, in response to the processor determining that only the information system of the aircraft is accessible by the mobile maintenance terminal, and transmit at least one maintenance command to the information system of the aircraft, in response to the processor determining that only the information system of the aircraft is accessible by the mobile maintenance terminal.

* * * * *